United States Patent
Chae et al.

(10) Patent No.: US 10,263,604 B2
(45) Date of Patent: Apr. 16, 2019

(54) TRIANGULAR WAVE GENERATOR

(71) Applicants: SK Hynix Inc., Icheon (KR); Seoul National University R&DB FOUNDATION, Seoul (KR)

(72) Inventors: Joohyung Chae, Seoul (KR); Hankyu Chi, Seoul (KR); Suhwan Kim, Seoul (KR); Deog-Kyoon Jeong, Seoul (KR)

(73) Assignees: SK HYNIX INC., Icheon (KR); SEOUL NATIONAL UNIVERSITY R&DB FOUNDATION, Seoul (KR)

( * ) Notice: Subject to any disclaimer, the term of this patent is extended or adjusted under 35 U.S.C. 154(b) by 10 days.

(21) Appl. No.: 15/590,864

(22) Filed: May 9, 2017

(65) Prior Publication Data
US 2017/0338806 A1    Nov. 23, 2017

(30) Foreign Application Priority Data
May 19, 2016  (KR) .................. 10-2016-0061213

(51) Int. Cl.
*H03K 4/06*   (2006.01)
*H03K 4/501*  (2006.01)
*H03K 5/1534* (2006.01)

(52) U.S. Cl.
CPC ........... *H03K 4/501* (2013.01); *H03K 5/1534* (2013.01)

(58) Field of Classification Search
CPC ............................. H03K 4/501; H03K 5/1534
USPC ..................................................... 327/131–140
See application file for complete search history.

(56) References Cited

U.S. PATENT DOCUMENTS

| | | | |
|---|---|---|---|
| 9,520,837 B1 * | 12/2016 | Choi | H03F 1/0222 |
| 9,680,453 B1 * | 6/2017 | Zanetta | H03K 4/501 |
| 2007/0164787 A1 * | 7/2007 | Grochowski | G01R 31/31726 326/46 |
| 2007/0205814 A1 * | 9/2007 | Chatal | H03K 17/145 327/112 |
| 2009/0160503 A1 * | 6/2009 | Chen | H03K 4/06 327/132 |
| 2010/0315143 A1 * | 12/2010 | Chen | H03F 1/305 327/175 |
| 2014/0125394 A1 * | 5/2014 | Hood | H03K 5/13 327/237 |
| 2015/0200659 A1 | 7/2015 | Tsao | |

FOREIGN PATENT DOCUMENTS

| | | | |
|---|---|---|---|
| JP | 2010087561 A | * | 4/2010 |
| JP | 2010087562 A | * | 4/2010 |
| KR | 10-1528764 B1 | | 6/2015 |

\* cited by examiner

*Primary Examiner* — Ryan Jager

(57) ABSTRACT

A triangular wave generator includes a wave generator configured to generate a triangular wave according to a clock signal and a control signal. The triangular wave generator further includes a wave controller configured to adjust a value of the control signal in a correction mode. The control signal includes a first bias control signal, a second bias control signal, and a capacitance control signal.

18 Claims, 9 Drawing Sheets

TRIANGULAR WAVE GENERATOR

CROSS-REFERENCE TO RELATED APPLICATION

The present application claims priority to Korean Patent Application No. 10-2016-0061213, filed on May 19, 2016, which is incorporated herein by reference in its entirety.

BACKGROUND

1. Field

Embodiments of the present disclosure relate to a triangular wave generator, and more particularly, to a triangular wave generator capable of generating triangular wave in a wide frequency range.

2. Description of the Related Art

Triangular wave generators are used in various electronic devices.

A conventional triangular wave generator may not be utilized in applications operating in a wide frequency range, because a frequency range of a triangular wave output from the conventional triangular wave generator is normally limited.

In addition, the conventional triangular wave generator may not generate a triangular wave as designed when a process-voltage-temperature (PVT) variation occurs.

Accordingly, a triangular wave generator capable of generating a triangular wave in a wide frequency range and capable of coping with a PVT variation is desirable.

SUMMARY

Various embodiments are directed to a triangular wave generator capable of generating triangular wave in a wide frequency range and capable of generating a triangular wave having a desired frequency though PVT variation exists.

In an embodiment, a triangular wave generator may include a wave generator configured to generate a triangular wave according to a clock signal and a control signal; and a wave controller configured to adjust a value of the control signal in a correction mode.

In an embodiment, a triangular wave generator may include a wave generator configured to generate an output voltage according to an input signal and a control signal, a comparator configured to compare a reference voltage with the output voltage corresponding to a triangular wave in a correction mode, a correction control circuit configured to adjust a value of the control signal according to an output signal of the comparator in the correction mode, a pulse generator configured to generate a pulse according to a clock signal, an inverter configured to invert the clock signal, a multiplexer configured to provide an output signal of the pulse generator and an output signal of the inverter to the wave generator as the input signal in the correction mode and to provide the clock signal as the input signal in a mode other the correction mode and a demultiplexer configured to provide the output voltage of the wave generator to the comparator in the correction mode.

DETAILED DESCRIPTION

Hereafter, various embodiments will be described below in more detail with reference to the accompanying drawings.

Figure 1:
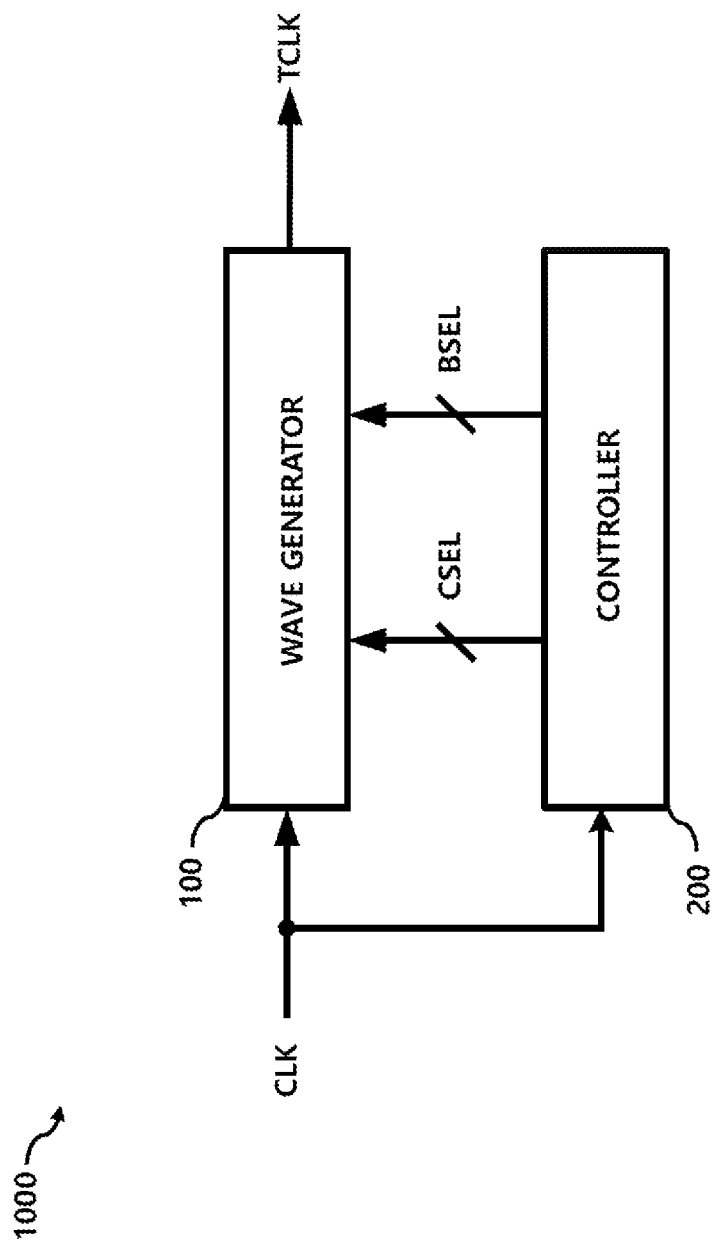
FIG. 1 is a block diagram of a triangular wave generator according to an embodiment of the present disclosure.

FIG. 1 is a block diagram of a triangular wave generator 1000 according to an embodiment.

The triangular wave generator 1000 includes a wave generator 100 and a wave controller 200.

The wave generator 100 generates a triangular wave TCLK using the input clock signal CLK.

The wave controller 200 generates a control signal for controlling a frequency of the triangular wave TCLK.

In the embodiment shown in FIG. 1, the control signal includes a capacitance control signal CSEL and a bias control signal BSEL. Each of the capacitance control signal CSEL and the bias control signal BSEL may be a multi-bit digital signal.

The triangular wave TCLK output from the wave generator 100 is controlled according to the control signals CSEL and BSEL output from the wave controller 200.

The wave controller 200 adjusts values of the control signals CSEL and BSEL in a correction mode and keeps the values of the control signals CSEL and BSEL substantially constant when the correction mode is complete.

The wave controller 200 performs the correction mode, for example, when the triangular wave generator 1000 is initialized, when a temperature of the triangular wave generator 1000 is changed over a predetermined range, when a predetermined period of time has elapsed, or when a signal for initiating the correction mode is received from an external device.

Figure 2:
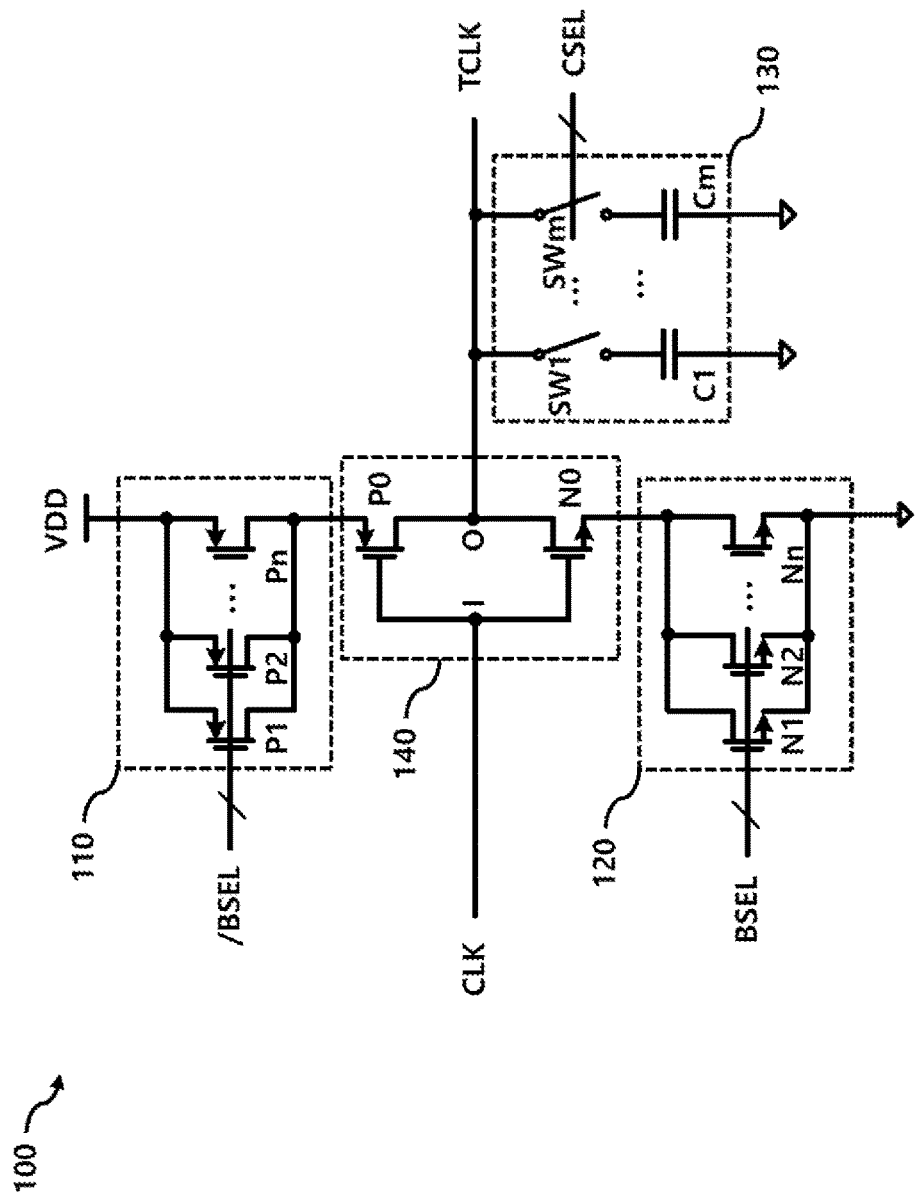
FIG. 2 is a circuit diagram of an example of a wave generator included in the triangular wave generator of FIG. 1.

FIG. 2 is a circuit diagram of an example of the wave generator 100 of FIG. 1.

The wave generator 100 includes a first bias control circuit 110, a second bias control circuit 120, a capacitance control circuit 130, and a signal transfer circuit 140.

The clock signal CLK is input to an input node I of the signal transfer circuit 140 and the triangular wave TCLK is output from an output node O of the signal transfer circuit 140.

The first bias control circuit 110, the signal transfer circuit 140, and the second bias control circuit 120 are connected in series between a power supply VDD and a ground.

The capacitance control circuit 130 is connected between the output node O of the signal transfer unit 140 and the ground.

The signal transfer unit 140 includes a p-channel metal-oxide-semiconductor (PMOS) transistor P0 and an n-channel metal-oxide-semiconductor (NMOS) transistor N0. The gates of the PMOS transistor P0 and NMOS transistor N0 are commonly connected to the input node I, and the drains of the PMOS transistor P0 and NMOS transistor N0 are commonly connected to the output node O.

The first bias control circuit 110 controls a first current flowing between the power supply VDD and the source of the PMOS transistor P0 of the signal transfer circuit 140 according to the first bias control signal /BSEL.

The first bias control unit 110 may include a plurality of PMOS transistors P1 to Pn, n being an integer greater than 1. Sources of the plurality of PMOS transistors P1 to Pn are connected to the power supply VDD and drains of the plurality of PMOS transistors P1 to Pn are connected to the source of the PMOS transistor P0.

Signals respectively indicating bits of the first bias control signal /BSEL may be input to corresponding gates of the plurality of PMOS transistors P1 to Pn.

The second bias control circuit 120 controls a second current flowing between the ground and the source of the NMOS transistor N0 of the signal transfer circuit 140 according to the second bias control signal BSEL.

The second bias controller 120 may include a plurality of NMOS transistors N1 to Nn. Sources of the plurality of NMOS transistors N1 to Nn are connected to the ground and drains of the plurality of NMOS transistors N1 to Nn are connected to a source of the NMOS transistor N0.

Signals respectively indicating bits of the second bias control signal BSEL may be input to corresponding gates of the plurality of NMOS transistors N1 to Nn.

A number of PMOS transistors turned on in the first bias control unit 110 may be changed according to the first bias control signals /BSEL. A number of NMOS transistors turned on in the second bias control unit 120 may be changed according to the second bias control signals BSEL. A bias current, which corresponds to the first current flowing from the power supply VDD to the source of the PMOS transistor P0 when the PMOS transistor P0 is on or the second current flowing from the source of the NMOS transistor N0 to the ground when the NMOS transistor N0 is on, may be controlled accordingly.

In an embodiment, the first bias control signal /BSEL is a signal obtained by inverting the bias control signal BSEL bit by bit, and the second bias control signal BSEL of FIG. 2 is the bias control signal BSEL of FIG. 1.

Accordingly, when a value of the bias control signal BSEL increases, a magnitude of the bias current that may be provided by the first bias control unit 110 and the second bias control unit 120 increases. For example, when the value of the bias control signal BSEL increases and the NMOS transistor N0 is turned on, a number of NMOS transistors turned on in the second bias control circuit 120 increases, leading to an increase in the magnitude of the second current flowing from the source of the NMOS transistor N0 to the ground.

In an embodiment, the current driving capacities of the first bias control circuit 110 and the second bias control circuit 120 are substantially equal to each other.

The capacitance control circuit 130 includes a plurality of capacitors C1 to Cm, which are coupled between the output node O of the signal transmission circuit 140 and the ground. Each of the plurality of capacitors C1 to Cm is connected to the output node O of the signal transfer circuit 140 via a corresponding one of the plurality of switches SW1 to SWm.

Each of the plurality of switches SW1 to SWm is turned on or off in response to a corresponding bit value of the capacitance control signal CSEL.

When the clock signal CLK has a logic low value which turns on the PMOS transistor P0, the bias current corresponding to the first current flowing through the first bias control circuit 110 and the PMOS transistor P0 charges one or more of the capacitors C1 to Cm of the capacity control circuit 130. When the clock signal CLK has a logic high value which turns on the NMOS transistor N0, the bias current corresponding to the second current flowing through the NMOS transistor N0 and the second bias control circuit 120 discharges the one or more charged capacitors of the capacity control circuit 130.

In the embodiment shown in FIG. 2, when the value of the capacitance control signal CSEL increases, a capacitance value of the capacitance control circuit 130 increases. In an embodiment, a capacitance value of the capacitance control circuit 130 corresponds to a sum of respective capacitance values of capacitors C1 to Cm having respective switches SW1 to SWm turned on.

The waveform of the triangular wave TCLK may be controlled according to the bias current controlled by the first bias control unit 110 and the second bias control circuit 120 and the capacitance value controlled by the capacitance control circuit 130. A slope of the triangular wave TCLK is proportional to the magnitude of the bias current and inversely proportional to the capacitance value of the capacitance control circuit 130.

As described above, the bias control signal BSEL and the capacitance control signal CSEL input to the wave generator 100 are determined by performing the correction mode in the wave controller 200.

Figure 3:
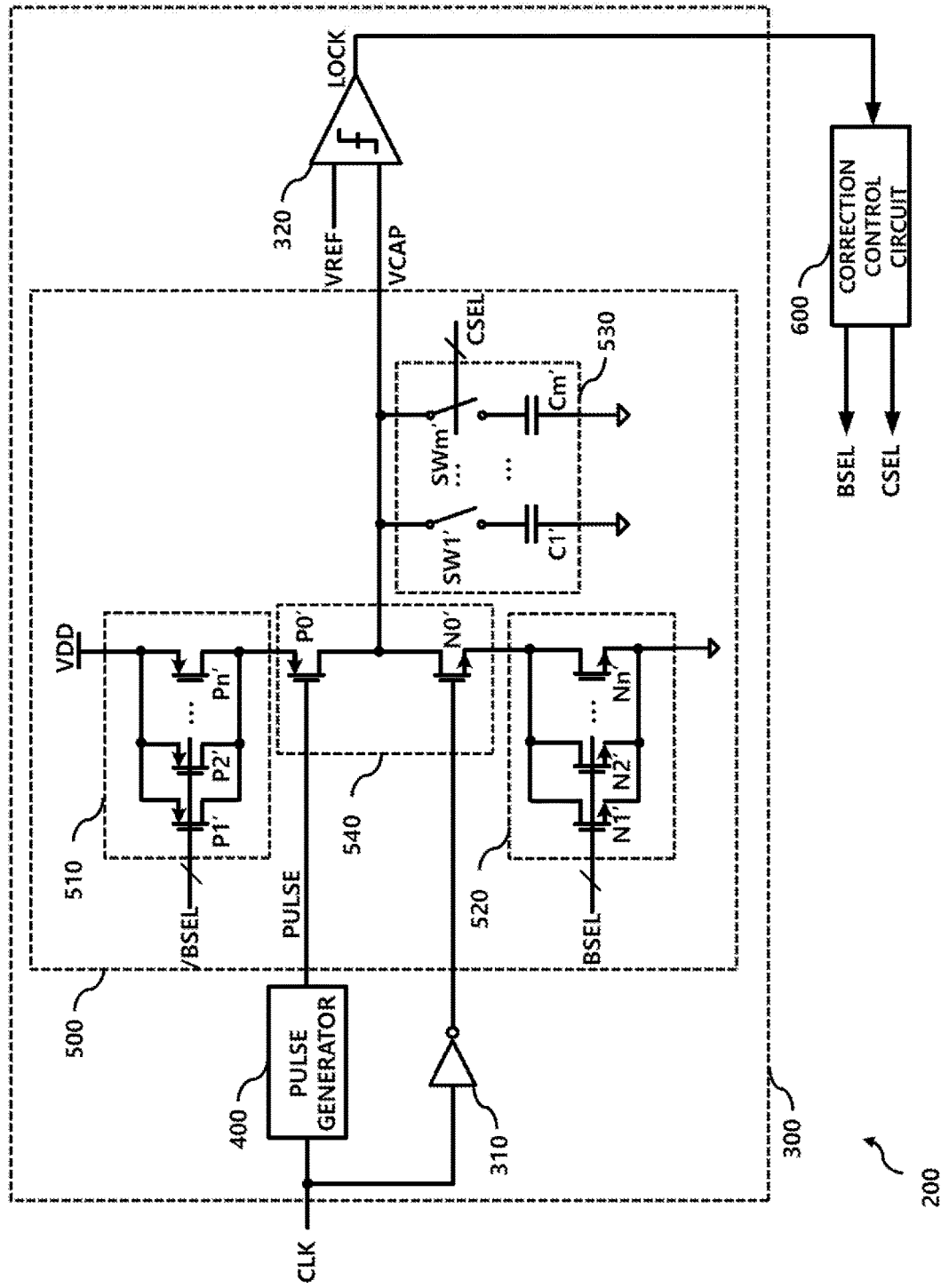
FIG. 3 is a circuit diagram of an example of a wave controller included in the triangular wave generator of FIG. 1.

FIG. 3 is a circuit diagram of an example of the wave controller 200 of FIG. 1.

The wave controller 200 includes a correction circuit 300 and a correction control circuit 600.

The correction circuit 300 includes a replica circuit 500 having a similar configuration to the wave generator 100 of FIG. 2, a pulse generator 400 generating a pulse signal PULSE based on the clock signal CLK and providing the generated pulse signal PULSE to the replica circuit 500, an inverter 310 inverting the clock signal CLK, and a comparator 320 comparing an output voltage VCAP of the replica circuit 500 with a reference voltage VREF.

In an embodiment, component elements P0' to Pn', N0' to Nn', SW1' to SWm', and C1' to Cm' of the replica circuit 500 are substantially identical to the corresponding respective component elements P0 to Pn, N0 to Nn, SW1 to SWm, and C1 to Cm of the wave generator 100 of FIG. 2.

The replica circuit 500 includes a first bias control replica circuit 510, a second bias control replica circuit 520, a capacitance control replica circuit 530, and a signal transfer replica circuit 540, which respectively correspond to the first bias control circuit 110, the second bias control circuit 120, the capacitance control circuit 130, and the signal transfer circuit 140 of FIG. 2.

Because the first bias control replica circuit 510, the second bias control replica circuit 520, the capacitance control replica circuit 530, and the signal transfer replica circuit 540 have substantially the same configuration as the corresponding circuits of the wave generator 100 of FIG. 2, detailed descriptions of these components are omitted herein for the interest of brevity.

On the other hand, the replica circuit 500 of FIG. 3 is different from the wave generator 100 of FIG. 2 in that gates of a PMOS transistor P0' and an NMOS transistor N0' of the signal transfer replica circuit 540 are not commonly connected. Instead, the gates of the PMOS transistor P0' and the NMOS transistor N0' of the signal transfer replica circuit 540 are respectively connected to the pulse generator 400 and the inverter 310.

The pulse signal PULSE output from the pulse generator 400 is applied to the gate of the PMOS transistor P0' of the signal transfer replica circuit 540, and an output signal of the inverter 310 is applied to the gate of the NMOS transistor N0' of the signal transfer replica circuit 540.

In the embodiment of FIG. 3, the pulse generator 400 generates pulses, each of the pulses having a width corresponding to a half period of the clock signal CLK. For example, a predetermined period of these pulses may be 16 times the period of the clock signal CLK.

At this time, the predetermined period may correspond to a time interval to perform a control operation in the correction mode, and will hereinafter be referred to as a control period.

A duration of the control period may vary according to embodiments.

In the embodiment shown in FIG. 3, the pulse signal PULSE is maintained at a logic high value and becomes a logic low value when a pulse is generated, and a time when the pulse signal PULSE transitions from the high logic value to the logic low value is synchronized with a rising edge of the clock signal CLK.

In other words, in this embodiment, the replica circuit 500 charges the capacitors C1' to Cm' of the capacitance control replica circuit 540 by turning on the PMOS transistor P0' in response to the pulse signal PULSE having the logic low value during a time interval of 0.5T, T being the period of the clock signal CLK, and discharges the capacitors C1' to Cm' when the clock signal CLK has a logic low value.

The comparator 320 activates the lock signal LOCK when the output voltage VCAP of the capacitance control replica circuit 530 becomes equal to or greater than the reference voltage VREF. For example, the lock signal LOCK is activated by being set to a logic high value when the output voltage VCAP of the capacitance control replica circuit 530 becomes equal to or greater than the reference voltage VREF.

In an embodiment, the reference voltage VREF has a level in a range of 90% to 95% of the power source voltage VDD. However, the level of the reference voltage VREF may vary according to embodiments.

When the lock signal LOCK is activated in this embodiment, the lock signal LOCK indicates that the values of the bias control signal BSEL and the capacitance control signal CSEL are determined to have desirable values, that is, values that will produce an acceptable triangle wave at the current frequency of the clock CLK.

The correction control circuit 600 changes the values of the bias control signal BSEL and the capacitance control signal CSEL for each control period and determines whether the lock signal LOCK is enabled during that control period.

The correction control circuit 600 ends the correction mode in response to the lock signal LOCK being asserted and determines the desirable values of the bias control signal BSEL and the capacitance control signal CSEL. In an embodiment, the desirable values of the bias control signal BSEL and the capacitance control signal CSEL of FIG. 3 determined during the correction mode are then latched and used as the values of the bias control signal BSEL and the capacitance control signal CSEL of FIG. 1 until the determination of new desirable values at the end of the next performance of the correction mode.

Figure 4:
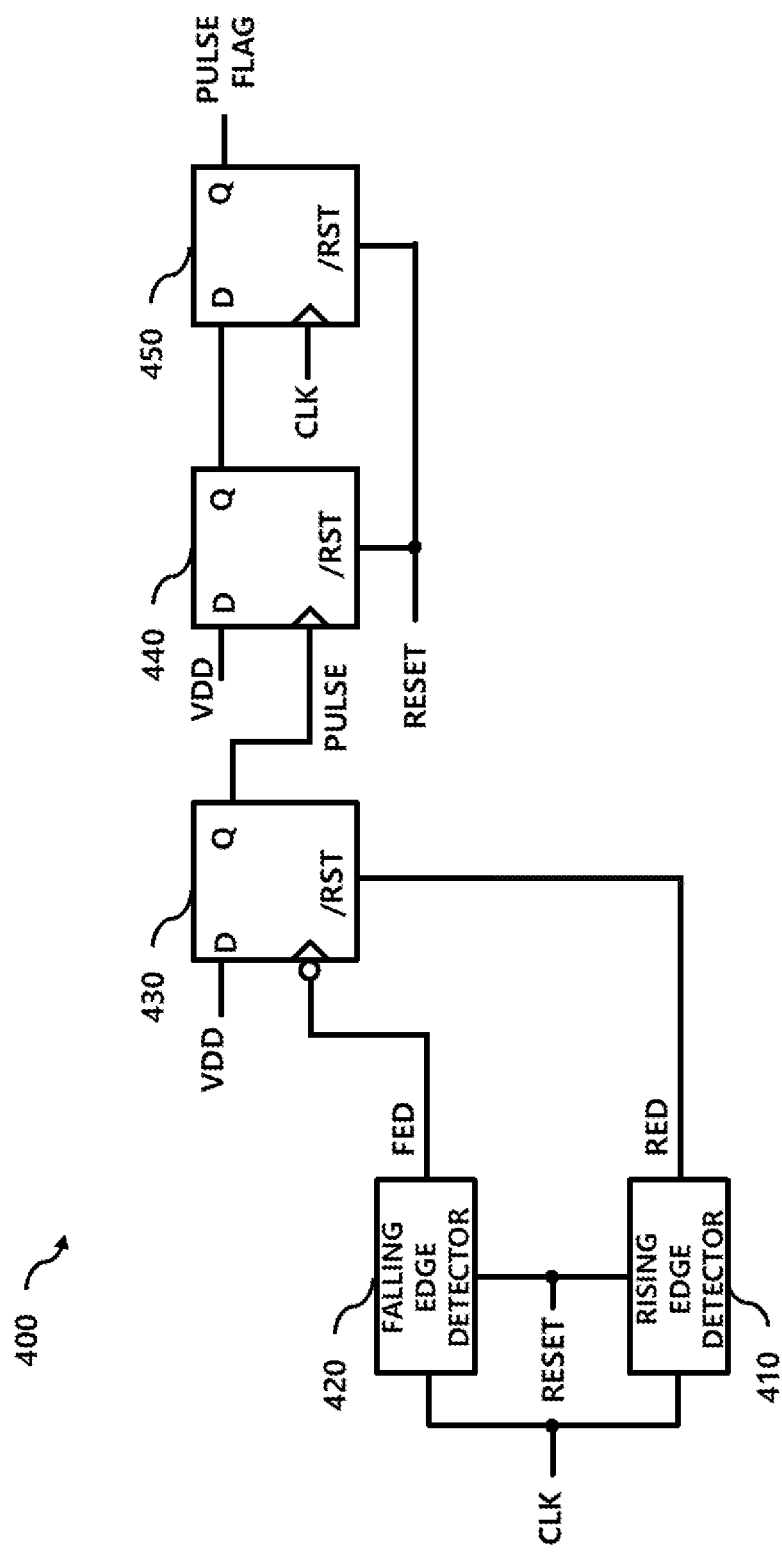
FIG. 4 is a circuit diagram of an example of a pulse generator included in the wave controller of FIG. 3.
Figure 7:
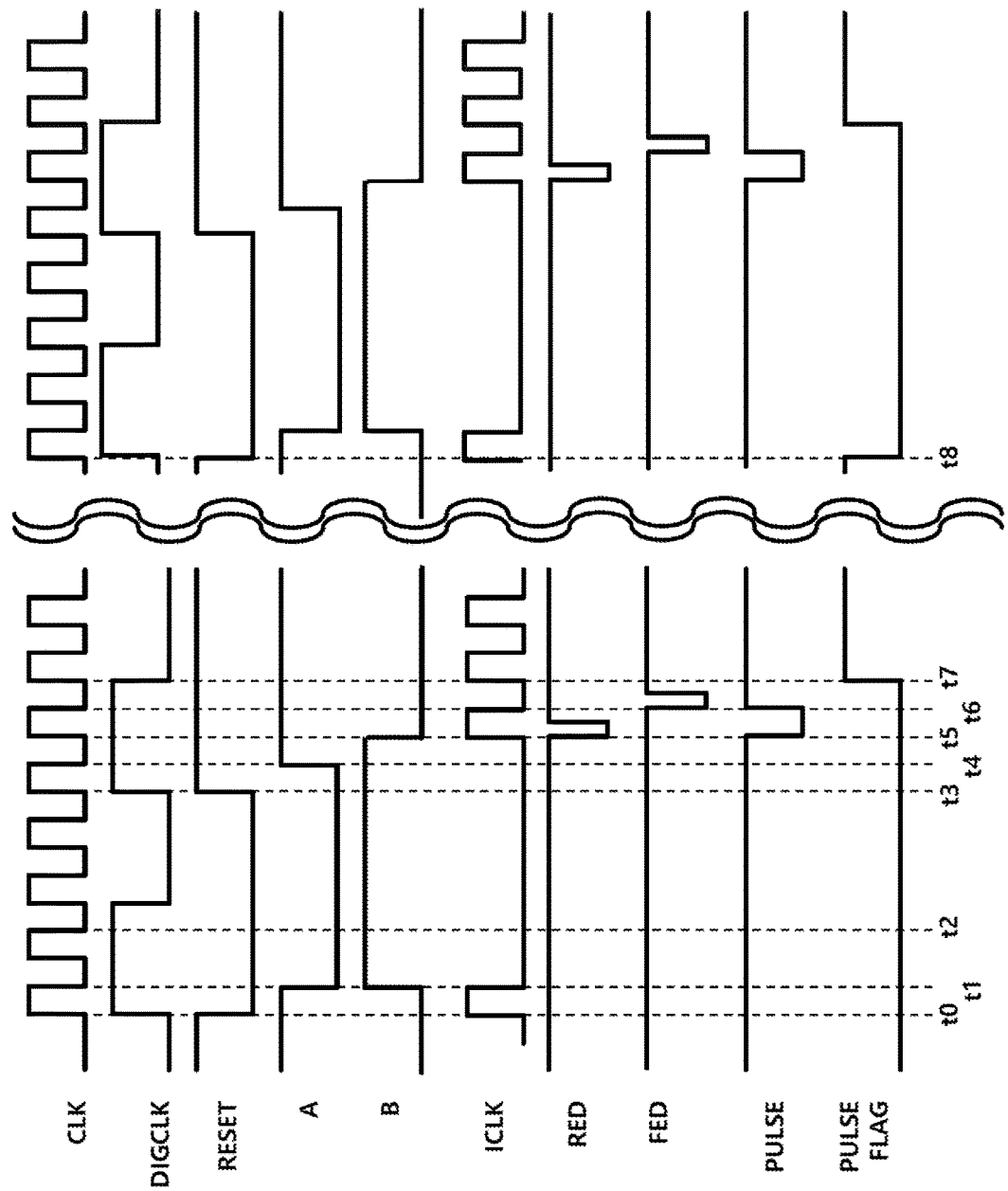
FIG. 7 is a timing diagram illustrating an operation of the pulse generator of FIG. 3 according to an embodiment.

FIG. 4 is a detailed block diagram of an example of the pulse generator 400 shown in FIG. 3. FIG. 7 is a timing diagram illustrating an operation of the pulse generator 400 of FIG. 4 according to an embodiment.

The pulse generator 400 includes a rising edge detector 410 detecting a rising edge of the clock signal CLK, a falling edge detector 420 detecting a falling edge of the clock signal CLK, and a first flip-flop 430 outputting a pulse signal PULSE according to a rising edge detection signal RED of the rising edge detector 410 and a falling edge detection signal FED of the falling edge detector 420.

In the embodiment shown in FIG. 7, the rising edge detector 410 and the falling edge detector 420 respectively detect the rising edge and the falling edge for every control period (e.g., equal to 16 times of the period of the clock signal CLK).

For example, the control period corresponds to the time interval between a zeroth time t0 corresponding to the falling edge of a reset signal RESET and an eighth time t8 corresponding to another falling edge in FIG. 7.

Operations of the rising edge detector 410 and the falling edge detector 420 will be described below in more detail with reference to FIGS. 5 to 7.

The divided clock signal DIGCLK is a signal obtained by dividing the clock signal CLK by four. For example, a frequency divider (not shown) divides a frequency of the clock signal CLK by a dividing factor of 4 to generate the divided clock signal DIGCLK.

The rising edge detector 410 outputs the rising edge detection signal RED including one pulse that has a logic low value in the control period equal to 16T, T being the period of the clock signal CLK.

The rising edge detection signal RED output from the rising edge detector 410 maintains a high value, and transitions from the logic high value to the logic low value in synchronization with a rising edge of the clock signal CLK, and then transitions from the logic low value to the logic high value again after a time interval shorter than the half period T/2 of the clock signal CLK.

The falling edge detector 420 outputs a falling edge detection signal FED including one pulse that has a logic low value in the control period equal to 16T.

The falling edge detection signal FED output from the falling edge detector 420 maintains a high value, transitions from the logic high value to the logic low value in synchronization with a falling edge of the clock signal CLK, and then transitions from the logic low value to the logic high value again after a time interval shorter than the half period T/2 of the clock signal CLK.

The pulse signal PULSE maintains a logic low value from a falling edge of the rising edge detection signal RED to the falling edge of a falling edge detection signal FED, and maintains the logic high value in the remaining time interval during the control period. For example, the pulse signal PULSE has the logic low value from a fifth time t5 corresponding to falling edge of the rising edge detection signal RED to a sixth time t6 corresponding to the falling edge detection signal FED.

Referring to FIG. 4, the first flip-flop 430 latches a signal VDD indicating a high value in synchronization with the falling edge of the falling edge detection signal FED. The first flip-flop 430 is reset to have a logic low value in response to the falling edge of the rising edge detection signal RED.

In the embodiment of FIG. 4, the pulse of the rising edge detection signal RED and the pulse of the falling edge detection signal FED are generated in a period when the reset signal RESET has a logic high value.

In the embodiment of FIGS. 4 and 7, the reset signal RESET maintains the logic low value for a period of the divided clock signal DIGCLK and maintains the logic high value for the remaining time interval of the control period.

The pulse generator 400 may further include a second flip-flop 440 for latching the signal VDD indicating the high logic value in response to the pulse signal PULSE, and a third flip-flop 450 for latching an output signal of the second flip-flop 440 in response to the clock signal CLK.

The second flip-flop 440 and the third flip-flop 450 are reset when the reset signal RESET has a logic low value.

The pulse flag signal (or the pulse flag) PULSE FLAG, which is an output signal of the third flip-flop 450, indicates that a pulse having a logic low value has occurred in the pulse signal PULSE.

The output signals of the second and third flip-flops 440 and 450 indicate a logic low value while the reset signal RESET has a logic low value.

The second flip-flop 440 latches and generates the output signal indicating the logic high value at a sixth time t6 corresponding to the rising edge of the pulse signal PULSE when the reset signal RESET has the logic high value.

Accordingly, the third flip-flop 450 latches the output signal of the second flip-flop 440 at a seventh time t7 corresponding to a rising edge of the clock signal CLK after the sixth time t6, and outputs the pulse flag signal PULSE FLAG indicating a logic high value.

The pulse flag PULSE FLAG maintains the high logic value until the reset signal RESET transitions from a logic high value to a logic low value.

The correction control circuit 600 performs a control operation at the seventh time t7 when the pulse flag PULSE FLAG is activated in consideration of the lock signal LOCK of the comparison circuit 320 of FIG. 3 to allow for a time required for the comparison operation of the comparison circuit 320.

Figure 5:
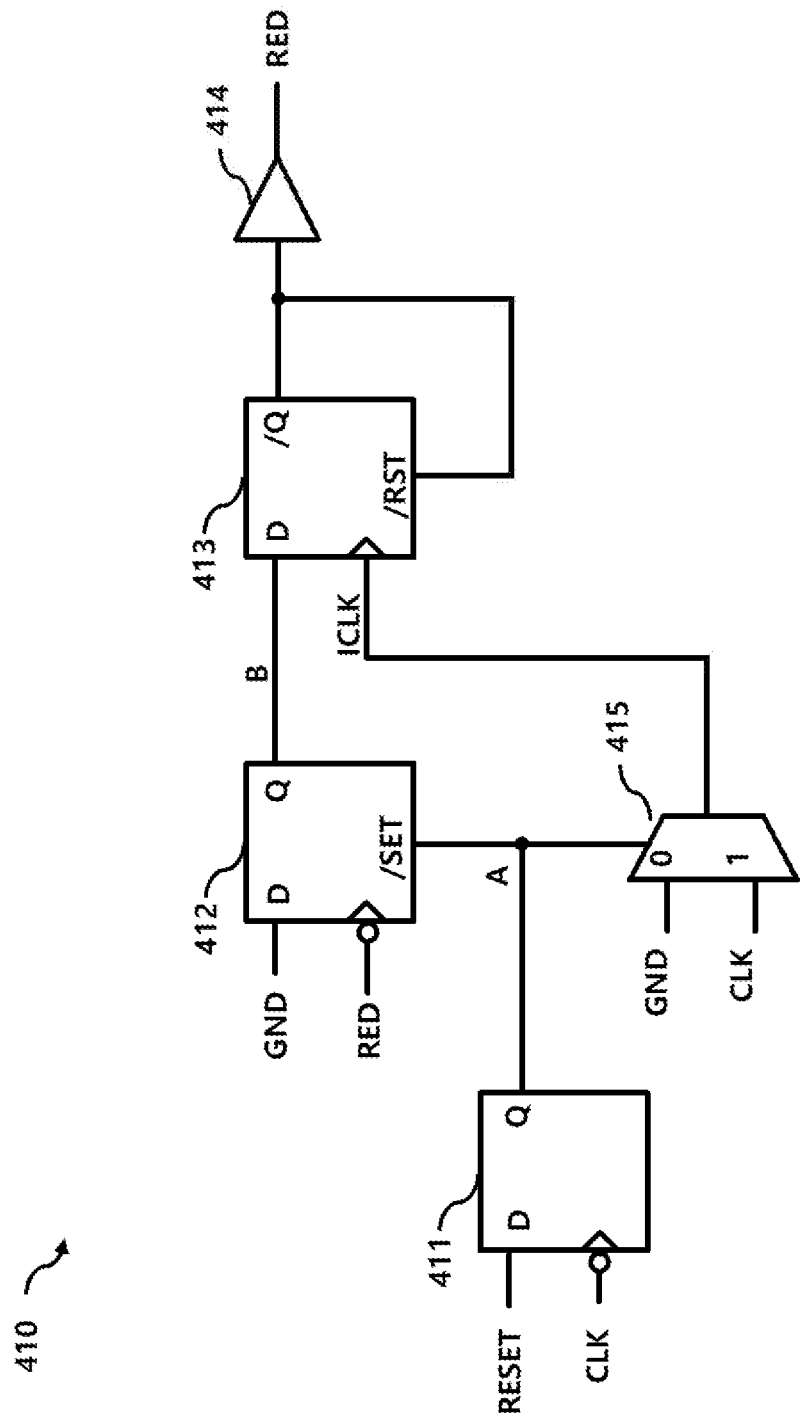
FIG. 5 is a circuit diagram of an example of a rising edge detector included in the pulse generator of FIG. 4.

FIG. 5 is a detailed block diagram of an example of the rising edge detector 410 of FIG. 4.

In FIG. 5, the rising edge detector 410 includes a first flip-flop 411, a second flip-flop 412, a third flip-flop 413, a buffer 414, and a selector 415.

The first flip-flop 411 latches the reset signal RESET in response to a falling edge of the clock signal CLK and outputs a first signal A.

As shown in FIG. 7, the first signal A is a delayed version of the reset signal RESET by the half period 0.5T of the clock signal CLK.

The second flip-flop 412 latches a signal GND indicating a logic low value in synchronization with a falling edge of the rising edge detection signal RED and outputs a second signal B having a logic high value when the first signal A has a logic low value.

As shown in FIG. 7, the second signal B transitions from the logic high value to the logic low value in synchronization with a falling edge of the rising edge detection signal RED corresponding to the fifth time t5, and transitions from the logic low value to the logic high value in synchronization with a falling edge of the first signal A corresponding to the first time t1.

The selector 415 selects the signal GND indicating the logic low value when the first signal A has a logic low value and selects the clock signal CLK when the first signal A has a logic high value to output an intermediate clock signal ICLK.

As shown in FIG. 7, the intermediate clock signal ICLK outputs the clock signal CLK in a period when the first signal A has the logic high value, and has a logic low value in the remaining period.

The third flip flop 413 latches the second signal B in response to a rising edge of the intermediate clock signal ICLK and is reset after a predetermined time interval.

As shown in FIG. 7, the third flip-flop 413 latches the second signal B at the fifth time t5 corresponding the rising edge of the intermediate clock signal ICLK.

Because the second signal B has the logic high value at the fifth time t5, an inverted output signal /Q of the third flip-flop 413 has a logic low value. As a result, the third flip-flop 413 is reset, and the inverted output signal /Q has a logic high value.

The buffer 414 buffers the inverted output /Q of the third flip-flop 413 and outputs a rising edge detection signal RED.

Figure 6:
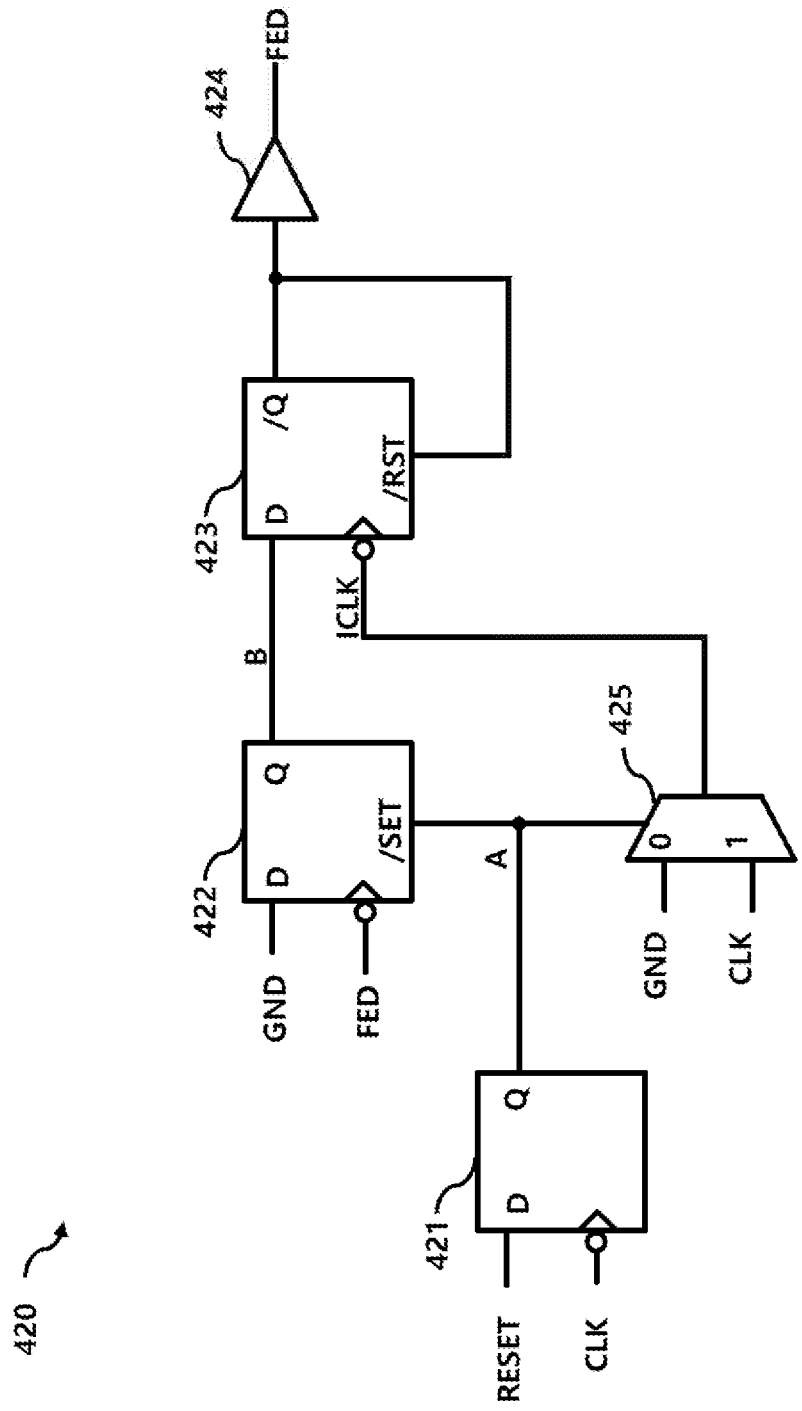
FIG. 6 is a circuit diagram of an example of a falling edge detector included in the pulse generator of FIG. 4.

FIG. 6 is a detailed block diagram of an example of the falling edge detector 420 of FIG. 4.

In FIG. 6, the falling edge detector 420 includes a first flip-flop 421, a second flip-flop 422, a third flip-flop 423, a buffer 424, and a selector 425.

Operations of the first flip-flop 421, the second flip-flop 422, the third flip-flop 423, the buffer 424, and the selector 425 are similar to those of the first flip-flop 411, the second flip-flop 412, the third flip-flop 413, the buffer 414, and the selector 415 of the rising edge detector 410 of FIG. 5, respectively.

However, the third flip-flop 423 of the falling edge detector 420 latches the second signal B in synchronization with a falling edge of the intermediate clock signal ICLK at the sixth time t6. For example, the third flip-flop 423 outputs an inverted output signal /Q in response to an inverted version of the intermediate clock signal ICLK, rather than the intermediate clock signal ICLK.

The buffer 424 buffers the inverted output signal /Q of the third flip-flop 423 and outputs a falling edge detection signal FED.

As described above, the pulse generator 400 generates the rising edge detection signal RED and the falling edge detection signal FED after the third time t3 corresponding to the rising edge of the reset signal RESET. The pulse generator 400 further generates a pulse signal PULSE having a width equal to the half period 0.5T of the clock signal CLK, which corresponds to a time interval between the fifth time t5 and the sixth time t6. The pulse signal PULSE occurs once every control period (e.g., having a duration equal to 16T).

As described above, the reset signal RESET can be generated using the clock signal CLK in the correction control circuit 600, and one cycle of the reset signal RESET corresponds to the control period 16T.

Figure 8:
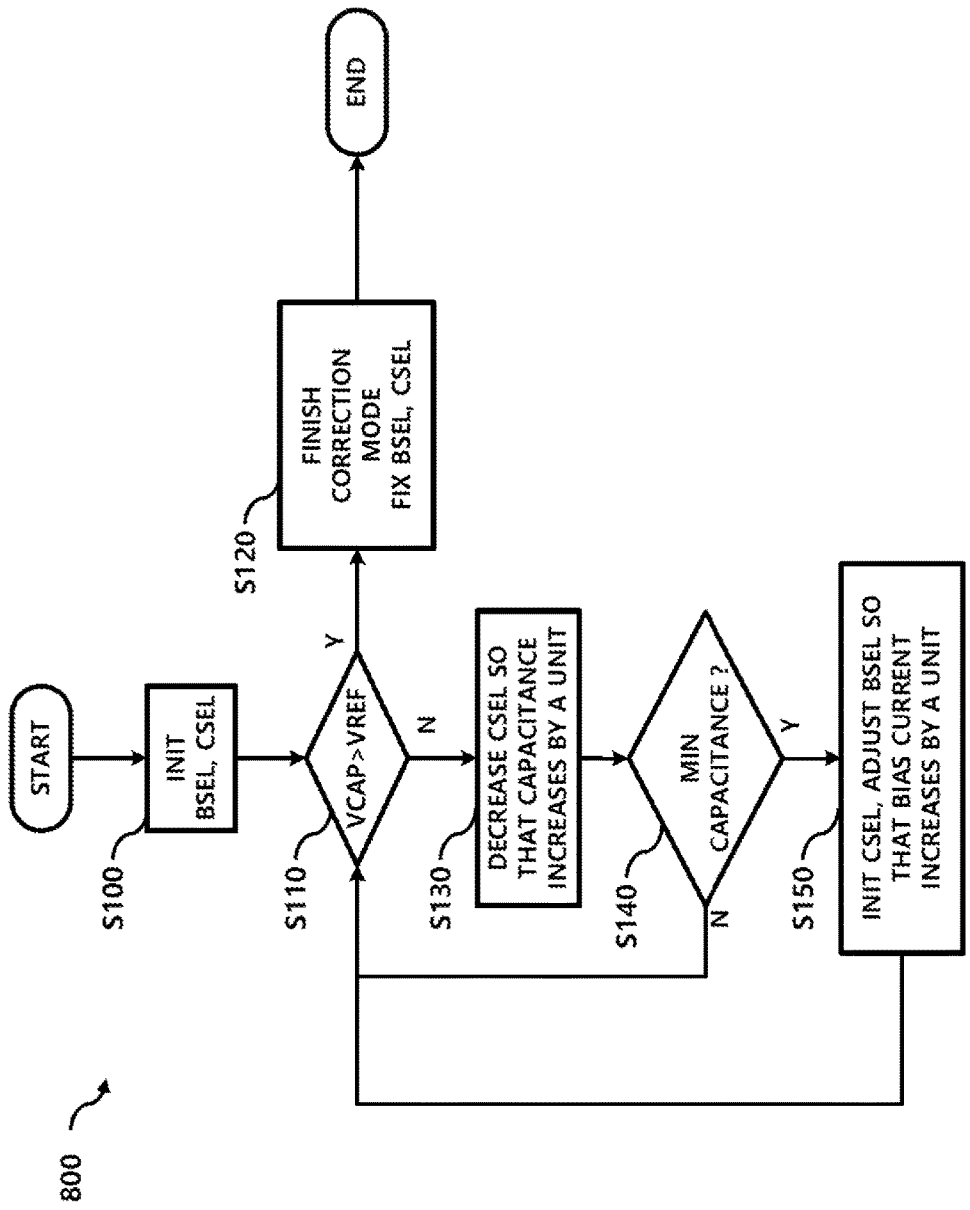
FIG. 8 is a flow chart illustrating an operation of a correction control unit of FIG. 3 according to an embodiment.

FIG. 8 is a flowchart illustrating a process 800 for controlling an operation of the correction control circuit 600 of FIG. 3, according to an embodiment.

At step S100, a value of the bias control signal BSEL and a value of the capacitance control signal CSEL are initialized.

In the embodiment of FIG. 8, the initial value of the bias control signal BSEL corresponds to a value at which the bias current has a minimum value, and the initial value of the capacitance control signal CSEL corresponds to the capacitance of the capacitance control replica circuit 530 has a maximum value.

At step S110, it is determined whether the output voltage VCAP of the capacitance control replica circuit 530 reached a level greater than the reference voltage VREF during a most recent cycle of the control period.

When the level of the output voltage VCAP reached a level greater than the reference voltage VREF, the LOCK signal of FIG. 3 is activated by setting to a specific logic value (e.g., a logic high value). In response, the correction control circuit 600 ends the correction mode and outputs the bias control signal BSEL and the capacitance control signal CSEL to the wave generator 100 of FIG. 2 at step S120.

When the level of the output voltage VCAP does not rise to a value greater than the reference voltage VREF during the current control period, the correction control circuit 600 adjusts the value of the capacitance control signal CSEL. As a result, the capacitance value of the capacitance control replica circuit 530 decreases by a predetermined amount at step S130.

At step S140, it is then determined whether the capacitance value of the capacitance control replica circuit 530 reaches a minimum value.

If the capacitance has reached the minimum value, the value of the capacitance control signal CSEL is initialized and the value of the bias control signal BSEL is adjusted so that the magnitude of the bias current is increased by a predetermined amount at step S150 and the operation proceeds to the step S110.

If the capacitance value has not reached the minimum value, the process 800 proceeds to the step S110.

The correction control circuit 600 performs the determination of step S110 once every control period (e.g., equal to 16T). More specifically, the determination at step S110 can be performed at a time (e.g., the seventh time t7 of FIG. 7) when the pulse flag PULSE FLAG is activated, based on whether the lock signal LOCK was asserted at any prior time in the current control cycle. In an illustrative embodiment, the correction control circuit 600 includes a latch having an output that is asserted in response to a rising edge of the lock signal LOCK and de-asserted when the reset signal RESET is low, and the correction control circuit 600 samples the output of the latch on a rising edge of the pulse flag PULSE FLAG.

Figure 9:
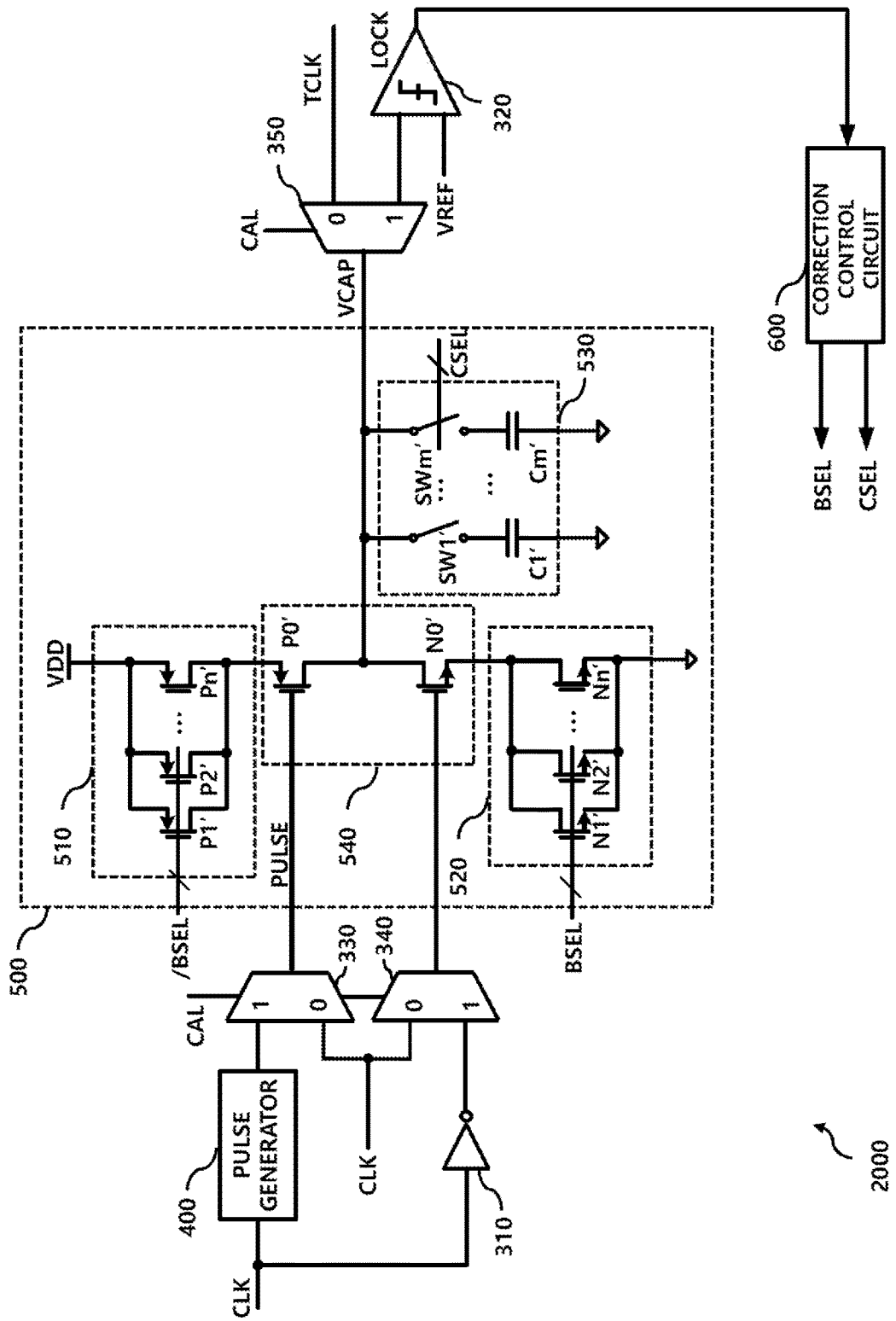
FIG. 9 is a block diagram of a triangular wave generator according to another embodiment of the present disclosure.

FIG. 9 is a circuit diagram showing a triangular wave generator 2000 according to another embodiment of the present disclosure.

The triangular wave generator 2000 integrates the wave generator 100 of FIG. 2 and the wave controller 200 of FIG. 3.

This is based on the fact that the circuits 110, 120, 130, and 140 of the wave generator 100 and corresponding circuits 510, 520, 530, and 540 of the replica circuit 500 in the wave controller 200 have substantially the same configurations, respectively, and the component elements P0' to Pn', N0' to Nn', SW1' to SWm', and C1' to Cm' of the replica circuit 500 are substantially identical to the corresponding respective component elements P0 to Pn, N0 to Nn, SW1 to SWm, and C1 to Cm of the wave generator 100.

The configuration of the triangular wave generator 2000 shown in FIG. 9 is similar to the configuration of the wave controller 200 of FIG. 3.

The triangular wave generator 2000 of FIG. 9 further includes first and second multiplexers 330 and 340 selecting signals to provide to the signal transfer replica circuit 540 according to a correction mode signal CAL. The triangular wave generator 2000 of FIG. 9 further includes a demultiplexer 350 outputting a signal VCAP from the signal transfer replica circuit 540 as one of the triangular wave TCLK and an input signal to a comparator 320 according to the correction mode signal CAL.

The correction mode signal CAL may be generated in the correction control circuit 600.

When the correction mode signal CAL is disabled to have a first logic value (e.g., a logic low value), the clock signal CLK is commonly input to the gates of the PMOS transistor P0' and the NMOS transistor N0' through the first multiplexer 330 and the second multiplexer 340, respectively, and the output voltage VCAP of the capacitance control replica circuit 530 is output as the triangular wave TCLK through the demultiplexer 350.

When the correction mode signal CAL is enabled to have a second logic value (e.g., a logic high value), an output signal of the pulse generator 400 is input to the gate of the PMOS transistor P0' through the first multiplexer 330, an output signal of the inverter 310 is input to the gate of the NMOS transistor N0' through the second multiplexer 340, and the output voltage VCAP of the capacitance control replica circuit 530 is provided to the comparator 320 through the demultiplexer 350.

Other operations of the triangular wave generator 2000 are similar to the operations of the wave generator 100 of FIG. 2 and the wave controller 200 of FIG. 3 as described above, and a detailed description thereof will be omitted herein for the interest of brevity.

Although various embodiments have been described for illustrative purposes, it will be apparent to those skilled in the art that various changes and modifications may be made without departing from the spirit and scope of the invention as defined in the following claims.

What is claimed is:

1. A triangular wave generator comprising:
a wave generator configured to generate a triangular wave according to a clock signal and a control signal; and
a wave controller configured to adjust a value of the control signal in a correction mode,
wherein the wave controller comprises:
a correction control circuit configured to control the control signal; and
a correction circuit configured to generate an output voltage corresponding to the triangular wave during a predetermined time interval according to the control signal and to compare the output voltage with a reference voltage,
wherein the correction control circuit adjusts a value of the control signal to adjust a maximum level of the output voltage, and
wherein the correction control circuit exits the correction mode when the maximum level of the output voltage is greater than a level of the reference voltage and maintains the value of the control signal.

2. The triangular wave generator of claim 1, wherein the control signal includes a first bias control signal, a second bias control signal, and a capacitance control signal, and
wherein the wave generator comprises:
a signal transfer circuit configured to receive the clock signal and to generate the triangular wave;
a first bias control circuit configured to conduct a first current from a power supply voltage to an output node of the signal transfer circuit, the first current having a magnitude according to the first bias control signal;
a second bias control circuit configured to conduct a second current from the output node of the signal transfer circuit to a ground, the second current having a magnitude according to the second bias control signal; and
a capacitance control circuit coupled between the output node of the signal transfer circuit and the ground terminal, the capacitance control circuit having a capacitance value according to the capacitance control signal.

3. The triangular wave generator of claim 2, wherein the signal transfer circuit comprises a PMOS transistor and an NMOS transistor, and
wherein gates of the PMOS transistor and the NMOS transistor are commonly connected, drains of the PMOS transistor and the NMOS transistor are commonly connected, a source of the PMOS transistor is connected to the first bias control circuit, a source of the NMOS transistor is connected to the second bias control circuit, and the drains of the PMOS transistor and the NMOS transistor are connected to the capacitance control circuit.

4. The triangular wave generator of claim 2, wherein the first bias control circuit comprises a PMOS transistor including a source connected to the power supply voltage, a drain connected to the signal transfer circuit, and a gate receiving the first bias control signal.

5. The triangular wave generator of claim 2, wherein the second bias control circuit comprises an NMOS transistor including a source connected to the ground, a drain connected to the signal transfer circuit, and a gate receiving the second bias control signal.

6. The triangular wave generator of claim 2, wherein the capacitance control circuit comprises a switch and a capacitor, the switch and the capacitor being connected in series between the output node of the signal transfer circuit and the ground, and the switch being controlled according to the capacitance control signal.

7. The triangular wave generator of claim 1, wherein the correction control circuit sequentially adjusts the value of the control signal to increase the maximum level of the output voltage.

8. The triangular wave generator of claim 1, wherein the predetermined time interval is substantially equal to a half of a period of the clock signal.

9. The triangular wave generator of claim 1, wherein the correction circuit comprises:
a pulse generator configured to generate a pulse signal including a pulse, the pulse having a width corresponding to the predetermined time interval;
a comparator configured to compare the output voltage with the reference voltage; and
a replica circuit configured to generate the output voltage according to the pulse signal of the pulse generator.

10. The triangular wave generator of claim 9, wherein the control signal includes a first bias control signal, a second bias control signal, and a capacitance control signal, and
wherein the replica circuit comprises:
a signal transfer replica circuit configured to receive the clock signal and to generate the output voltage;
a first bias control replica circuit configured to conduct a first current from a power supply voltage to an output node of the signal transfer replica circuit, the first current having a magnitude according to the first bias control signal;
a second bias control replica circuit configured to conduct a second current from the output node of the signal transfer replica circuit to a ground, the second current having a magnitude according to the second bias control signal; and
a capacitance control replica circuit coupled between the output node of the signal transfer replica circuit and the ground, the capacitance control replica circuit having a capacitance value according to the capacitance control signal.

11. The triangular wave generator of claim 10, wherein the signal transfer replica circuit comprises a PMOS transistor and an NMOS transistor, and
wherein gates of the PMOS transistor and the NMOS transistor are commonly connected, drains of the PMOS transistor and the NMOS transistor are commonly connected, a source of the PMOS transistor is connected to the first bias control replica circuit, a source of the NMOS transistor is connected to the second bias controller replica circuit, and the drains of the PMOS transistor and the NMOS transistor are connected to the capacitance control replica circuit.

12. The triangular wave generator of claim 9, wherein the pulse has a first edge and a second edge, the second edge being subsequent to the first edge, and
wherein the correction control circuit adjusts a value of the control signal based on an output signal of the comparator at a time equal to a sum of a delay time and a time corresponding to the second edge of the pulse.

13. The triangular wave generator of claim 12, wherein the delay time is substantially equal to a half of a period of the clock signal.

14. A triangular wave generator comprising:
a wave generator configured to generate an output voltage according to an input signal and a control signal;
a comparator configured to compare a reference voltage with the output voltage corresponding to a triangular wave in a correction mode;
a correction control circuit configured to adjust a value of the control signal according to an output signal of the comparator in the correction mode;
a pulse generator configured to generate a pulse according to a clock signal;
an inverter configured to invert the clock signal;
a multiplexer configured to provide an output signal of the pulse generator and an output signal of the inverter to the wave generator as the input signal in the correction mode, and to provide the clock signal as the input signal in a mode other than the correction mode; and
a demultiplexer configured to provide the output voltage of the wave generator to the comparator in the correction mode.

15. The triangular wave generator of claim 14, wherein the control signal includes a first bias control signal, a second bias control signal, and a capacitance control signal, and
wherein the wave generator comprises:
a signal transfer circuit configured to receive the input signal and to output the output voltage corresponding to a triangular wave;
a first bias control circuit configured to conduct a first current from a power supply voltage to an output node of the signal transfer circuit, the first current having a magnitude according to the first bias control signal;
a second bias control circuit configured to conduct a second current from the output node of the signal transfer circuit to a ground, the second current having a magnitude according to the second bias control signal; and
a capacitance control circuit coupled between the output node of the signal transfer circuit and the ground, the capacitance control circuit having a capacitance value according to the capacitance control signal.

16. The triangular wave generator of claim 15, wherein the correction control circuit sequentially adjusts a value of the first bias control signal, a value of the second bias control signal, and a value of the capacitance control signal to increase a maximum level of the output voltage in the correction mode.

17. The triangular wave generator of claim 16, wherein the correction control circuit exits the correction mode when the maximum level of the output voltage is greater than a level of the reference voltage and maintains the value of the first bias control signal, the value of the second bias control signal, and the value of the capacitance control signal.

18. The triangular wave generator of claim 14, wherein the pulse has a width substantially equal to a half of a period of the clock signal.

* * * * *